United States Patent
Khajehnejad et al.

(10) Patent No.: US 8,648,742 B2
(45) Date of Patent: Feb. 11, 2014

(54) SYSTEMS AND METHODS FOR ACQUIRING AND DECODING SIGNALS USING COMPRESSED SENSING

(75) Inventors: Mohammad A. Khajehnejad, Pasadena, CA (US); Babak Hassibi, San Marino, CA (US); Juhwan Yoo, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/406,509

(22) Filed: Feb. 27, 2012

(65) Prior Publication Data

US 2012/0249353 A1 Oct. 4, 2012

Related U.S. Application Data

(60) Provisional application No. 61/446,859, filed on Feb. 25, 2011.

(51) Int. Cl.
*H03M 1/12* (2006.01)

(52) U.S. Cl.
USPC ............ 341/155; 341/122; 341/118; 702/196

(58) Field of Classification Search
USPC .......... 341/122, 155, 143, 118, 120; 714/800, 714/801; 702/196
See application file for complete search history.

(56) References Cited

U.S. PATENT DOCUMENTS

| | | | |
|---|---|---|---|
| 5,381,143 A | 1/1995 | Shimoyoshi et al. | |
| 2004/0151213 A1 | 8/2004 | Nakamura et al. | |
| 2009/0153379 A1 | 6/2009 | Cormode et al. | |
| 2011/0241934 A1* | 10/2011 | Sarkis | 342/191 |
| 2011/0273320 A1* | 11/2011 | Nogueira-Nine | 342/27 |
| 2012/0224611 A1* | 9/2012 | Baheti et al. | 375/219 |
| 2012/0249136 A1* | 10/2012 | Marinelli et al. | 324/309 |

FOREIGN PATENT DOCUMENTS

| | | |
|---|---|---|
| EP | 1912445 A1 | 4/2008 |
| WO | 2012/128897 A2 | 9/2012 |

OTHER PUBLICATIONS

International Search Report and Written Opinion for International Application No. PCT/US2012/026834, completed Jan. 23, 2013, 6 pgs.
Candes, Emmanuel et al., "An Introduction to Compressive Sampling", IEEE Signal Processing Magazine, Mar. 2008, pp. 21-30.

(Continued)

*Primary Examiner* — Peguy Jean Pierre
(74) *Attorney, Agent, or Firm* — KPPB LLP

(57) ABSTRACT

Systems and methods in accordance with embodiments of the invention utilize a CS architecture based on a sub-linear time recovery process (with reduced memory requirements). In several embodiments, a novel structured measurement matrix is exploited during signal acquisition allowing the use of a recovery process based on relatively simple computational primitives making it more amenable to implementation in a fully-integrated form. One embodiment of the invention includes an analog front end configured to receive an analog input signal, and CS sampling circuitry connected to an output of the analog front end and configured to generate a plurality of measurements using a structured measurement matrix, where each row of the structured measurement matrix is generated using a different predetermined check node. In addition, the CS sampling circuitry is configured to generate the plurality of measurements at a rate that is less than the Nyquist rate of the analog input signal.

30 Claims, 7 Drawing Sheets

(56) References Cited

OTHER PUBLICATIONS

Chen, Fred et al., "A Signal-agnostic Compressed Sensing Acquisition System for Wireless and Implantable Sensors", Custom Integrated Circuits Conference (CICC), 2010 IEEE, Date of Conference: Sep. 19-22, 2010, pp. 1-4.

Khajehnejad, Amin et al., Democratic Compressed Sensing (DCS), Dec. 9, 2010, pp. 1-14.

Rauhut, Holger, "Compressive Sensing and Structured Random Matrices", Radon Series Comp. Appl. Math XX, Jun. 12, 2011, pp. 1-94.

Tropp, Joel et al., "Computational Methods for Sparse Solution of Linear Inverse Problems", Proceedings of the IEEE, vol. 98, No. 6, Jun. 2010, 11 Pages, pp. 948-958.

Yoo, Juhwan et al., "An Analog Sub-Linear Time Sparse Signal Acquisition Framework Based On Structured Matrices", Acoustics, Speech and Signal Processing (ICASSP), 2012 IEEE International Conference, Mar. 25-30, 2012, pp. 1-4.

Yoo, Juhwan et al., "Design and Implementation of a Fully Integrated Compressed-Sensing Signal Acquisition System", Acoustics, Speech and Signal Processing (ICASSP), 2012 IEEE International Conference, Mar. 25-30, 2012, pp. 1-4.

\* cited by examiner

| Rows of Measurement Matrix | Elements set to binary 1 in row |
|---|---|
| R1 = [1 1 0 0 1 1 0 0 0 0 0 0 0 0 0 0] | 1,2,5,6 |
| R2 = [1 0 0 0 1 0 0 0 1 0 0 0 1 0 0 0] | 1,5,9,13 |
| R3 = [1 1 0 0 0 0 0 0 1 0 0 0 0 0 0 0] | 1,2,9,10 |
| R4 = [0 1 1 0 0 0 0 0 0 1 0 0 0 0 0 0] | 2,3,10,11 |
| R5 = [0 0 1 0 0 0 1 0 0 0 1 0 0 0 1 0] | 3,7,11,15 |
| R6 = [0 0 1 1 0 0 1 1 0 0 0 0 0 0 0 0] | 3,4,7,8 |
| R7 = [0 1 0 0 0 1 0 0 0 1 1 0 0 0 0 0] | 2,6,10,11 |
| R8 = [0 0 0 0 0 0 0 0 0 0 1 1 0 0 1 1] | 11,12,15,16 |
| R9 = [0 0 0 0 0 0 0 0 1 1 0 1 1 1 0 0] | 9,10,13,14 |
| R10 = [0 0 0 1 0 0 0 1 0 0 0 1 0 0 0 1] | 4,8,12,16 |
| R11 = [0 0 0 0 1 1 0 0 0 0 0 0 1 1 0 0] | 5,6,13,14 |
| R12 = [0 0 0 0 0 0 1 1 0 0 0 0 0 0 1 1] | 7,8,15,16 |

*FIG. 2*

SYSTEMS AND METHODS FOR ACQUIRING AND DECODING SIGNALS USING COMPRESSED SENSING

CROSS-REFERENCE TO RELATED APPLICATION

The present application claims the benefit under 35 U.S.C. 119(e) of the filing date of U.S. Provisional Application Ser. No. 61/446,859 filed Feb. 25, 2011, the disclosure of which is incorporated by reference herein in its entirety.

FIELD OF THE INVENTION

The present invention relates to wideband spectrum sensing and estimation and more specifically to wideband spectrum sensing and estimation using Compressed Sensing.

BACKGROUND

The theory of compressive sampling, also known as compressed sensing or CS, is regarded as having been developed by Emmanuel Candès, Justin Romberg, Terence Tao and David Donoho. The following overview of CS is largely drawn from Emmanuel J. Candes and Michael B. Wakin, *An Introduction to Compressive Sampling*, IEEE Signal Processing Magazine 21 (March 2008).

CS is a novel sensing/sampling paradigm that goes against the common wisdom in data acquisition. CS theory asserts that one can recover certain signals from far fewer samples or measurements than traditional methods that follow Shannon's theorem: the sampling rate must be at least twice the maximum frequency present in the signal (the so-called Nyquist rate). To make this possible, CS relies on two principles: sparsity, which pertains to the signals of interest, and incoherence, which pertains to the sensing modality.

Sparsity expresses the idea that the "information rate" of a continuous time signal may be much smaller than suggested by its bandwidth, or that a discrete-time signal depends on a number of degrees of freedom, which is comparably much smaller than its (finite) length. More precisely, CS exploits the fact that many natural signals are sparse or compressible in the sense that they have concise representations when expressed in an appropriate basis.

Incoherence extends the duality between time and frequency and expresses the idea that objects have a sparse representation in one domain can be spread out in the domain in which they are acquired, just as a Dirac or spike in the time domain is spread out in the frequency domain. Put differently, incoherence says that unlike the signal of interest, the sampling/sensing waveforms are capable of having an extremely dense representation in an appropriate domain.

According to the theory of CS, one can design efficient sensing or sampling protocols that capture the useful information content embedded in a sparse signal and condense it into a small amount of data. These protocols are nonadaptive and simply involve correlating the signal with a small number of fixed waveforms that are incoherent with the sparsifying basis. What is most remarkable about these sampling protocols is that they allow a sensor to very efficiently capture the information in a sparse signal without trying to comprehend the signal. Further, there is a way to use numerical optimization to reconstruct the full-length signal from the small amount of collected data. In other words, systems based on CS principles can sample—in a signal independent fashion—at a low rate and later use computation power for reconstruction from what appears to be an incomplete set of measurements. Effectively, such systems sense and compress data simultaneously (thus the name compressed sensing).

Sparsity

Systems that perform CS typically are faced with the problem in which information about a signal f(t) is obtained by linear functionals recording the values:

$$y_k = \langle f, \phi_k \rangle$$

The objects that the system wishes to acquire can simply be correlated with the waveforms $\phi_k(t)$. This is a standard configuration. If the sensing waveforms are Dirac delta functions (spikes), for example, then y is a vector of sampled values of f in the time or space domain. It the sensing waveforms are sinusoids, then y is a vector of Fourier coefficients; this is the sensing modality used in magnetic resonance imaging MRI.

Systems can apply CS to recover information in undersampled situations. Undersampling refers to a circumstance in which the number M of available measurements is much smaller than the dimension N of the signal f. Such problems are extremely common for a variety of reasons. For instance, the number of sensors may be limited, the measurements can be extremely expensive (e.g. certain imaging processes via neutron scattering), or the sensing process may be slow so that one can only measure the object a few times (e.g. in an MRI).

In undersampled situations, a CS system is faced with the task of solving an underdetermined linear system of equations. Letting A denote the M×N sensing or measurement matrix with the vectors $\phi_1^*, \ldots, \phi_M^*$ as rows (a* is the complex transpose of a), the process of recovering $f \in \mathbb{R}^N$ from $y = Af \in \mathbb{R}^M$ is ill-posed in general when M<N: there are infinitely many candidate signals for f. Shannon's theory indicates that, if f(t) has low bandwidth, then a small number of (uniform) samples will suffice for recovery. Using CS, signal recovery can actually be made possible using a broader class of signals.

Many natural signals have concise representations when expressed in a convenient basis. Mathematically speaking, a vector $f \in \mathbb{R}^N$ can be expanded in an orthonormal basis $\Psi = [\psi_1 \psi_2 \ldots \psi_N]$ as follows:

$$f(t) = \sum_{i=0}^{N} x_i \psi_i(t)$$

where x is the coefficient sequence of f, $x_i = \langle f, \psi_k \rangle$.

It can be convenient to express f as $\Psi x$ (where $\Psi$ is the N×N matrix with $\psi_1, \ldots, \psi_n$ as columns). The implication of sparsity is now clear: when a signal is a sparse expansion, the small coefficients can be discarded without much perceptual loss. Formally, consider $f_s(t)$ obtained by keeping only the terms corresponding to the S largest values of $(x_i)$. By definition $f_s := \Psi x_s$, where $x_s$ is the vector of coefficients $(x_i)$ with all but the largest S set to zero. This vector is sparse in a strict sense since all but a few of its entries are zero. Since $\Psi$ is an orthonormal basis, $\|f - f_s\|_{l_2} = \|x - x_s\|_{l_2}$, and if x is sparse or compressible in the sense that the sorted magnitudes of the $(x_i)$ decay quickly, then x is well approximated by $x_s$ and, therefore, the error $\|f - f_s\|_{l_2}$ is small. In plain terms, one can "throw away" a large fraction of the coefficients without much loss. As can be appreciated, sparsity is a fundamental modeling tool which permits efficient fundamental signal processing; e.g., accurate statistical estimation and classification, efficient data compression, etc. Sparsity has more surprising and far-reaching implications, however, which is that sparsity has significant bearing on the acquisition process itself. Sparsity determines how efficiently one can acquire signals nonadaptively.

Incoherent Sampling

Consider a pair ($\Phi$, $\Psi$) of orthonormal bases or orthobases of $\mathbb{R}^N$. The first basis D is used for sensing the object f and the second $\Psi$ is used to represent f. The coherence between the sensing basis $\Phi$ and the representation basis $\Psi$ is $$\mu(\Phi, \Psi) = \sqrt{N} \cdot \max_{1 \le k, j \le N} |\langle \varphi_k, \psi_j \rangle|$$

In plain English, coherence measures the largest correlation between any two elements of $\Phi$ and $\Psi$. If $\Phi$ and $\Psi$ contain correlated elements, the coherence is large. Otherwise, it is small. As for how large and how small, it follows from linear algebra that $\mu(\Phi, \Psi) \in [1, \sqrt{N}]$.

Compressive sampling is mainly concerned with low coherence pairs of bases. Such bases include the time frequency pair where $\Phi$ is the canonical or spike basis and $\Psi$ is the Fourier basis, and wavelet bases for $\Psi$ and noiselet basis for $\Phi$. Random matrices are largely incoherent with any fixed basis $\Psi$. Select an orthobasis $\Phi$ uniformly at random, then with high probability, the coherence between $\Phi$ and $\Psi$ is about $\sqrt{2\log N}$. In terms of hardware cost and complexity, it is desirable if the signal basis, $\Psi$, does not need to be known a priori in order to determine a viable sensing matrix $\Phi$. Fortunately, random sensing matrices with sufficient sample size exhibit low coherence with any fixed basis. This means that a random sensing matrix can acquire sufficient measurements to enable signal reconstruction of a sparse signal without knowing a priori the proper basis $\Psi$ for the signal.

Undersampling and Sparse Signal Recovery

Ideally, the N coefficients of f are observed, but in reality a CS system can only observe a subset of these and collect the data $$y_k = \langle f, \phi_k \rangle_{k \in M}$$

where $M \subset [1, \ldots, n]$ is a subset of cardinality M<N.

With this information, a conventional approach is to recover the signal by $l_1$-norm minimization. Essentially, for all objects consistent with the data, find the object with the coefficient sequence that minimizes the $l_1$-norm. The use of the $l_1$-norm as a sparsity-promoting function traces back several decades. A leading early application was reflection seismology, in which a sparse reflection function (indicating meaningful changes between subsurface layers) was sought from bandlimited data. However $l_1$-norm minimization is not the only way to recover sparse solutions; other methods, such as greedy algorithms, or Orthogonal Matching Pursuit can also be utilized.

In view of the above, CS suggests a very concrete acquisition protocol: sample nonadaptively in an incoherent domain and invoke linear programming after the acquisition step. Following this protocol enables the acquisition of a signal in a compressed form. A decoder can then "decompress" this data.

SUMMARY OF THE INVENTION

Advances in compressed sensing (CS) have sparked interest in designing information acquisition systems that process data at close to the information rate. Many initial proposals for CS signal acquisition systems utilized random measurement matrix ensembles in conjunction with convex relation based signal reconstruction algorithms. While providing universal performance bounds, random measurement matrix based formulations present several practical problems due to: the difficulty in physically implementing key mathematical operations, and their dense representation. Systems and methods in accordance with embodiments of the invention utilize a CS architecture that is based on a sub-linear time recovery process (with reduced memory requirements). In several embodiments, a novel structured measurement matrix is exploited during signal acquisition allowing the use of a recovery process based on relatively simple computational primitives making it more amenable to implementation in a fully-integrated form.

One embodiment of the invention includes an analog front end configured to receive an analog input signal, and CS sampling circuitry connected to an output of the analog front end and configured to generate a plurality of measurements using a structured measurement matrix, where each row of the structured measurement matrix is generated using a different predetermined check node. In addition, the CS sampling circuitry is configured to generate the plurality of measurements at a rate that is less than the Nyquist rate of the analog input signal.

In a further embodiment, the CS sampling circuitry comprises a plurality of parallel channels, where each of the plurality of parallel channels includes: parity check logic configured to generate a bit sequence using a predetermined check node; a mixer configured to modulate the bit sequence with the analog input signal, where the bit sequence has a rate that is greater than or equal to the Nyquist rate of the analog input signal; a discretization circuit configured to integrate the output of the mixer over a predetermined time period, where the predetermined time period corresponds to a rate that is less than the Nyquist rate of the analog input signal; and an analog to digital converter configured to digitize the output of the discretization circuit.

Another embodiment also includes a transmitter configured to transmit the plurality of measurements via a communication channel.

In a still further embodiment, the predetermined check nodes are generated by generating an (n, d) summary corresponding to each of the plurality of measurements, where each (n, d) summary is a pair (S, c), where: S is a randomly generated subset of $\{1, 2, \ldots, n\}$ of a predetermined size d, c is a binary sequence of length d, and N is the length of the binary sequence generated by the parity check logic using the check node and $N = 2^n$.

Still another embodiment of the invention includes a receiver configured to receive a measurement vector, dominant value index inference logic configured to identify the measurement value that occurs with the highest frequency in the measurement vector and the elements of the measurement vector that have the identified value, dominant element index inference graph logic configured to use the rows of the structured measurement matrix that generated the measurement vector to identify an element of a reconstructed input signal that is most likely to have resulted in the observed measurement vector and to assign the identified value to the identified element of the reconstructed input signal, memory configured to store the elements of the reconstructed input signal, and estimate update logic configured to update the measurement vector by subtracting the product of the measurement matrix and the reconstructed input signal from the previous measurement vector.

In a yet further embodiment, the dominant value index inference logic is configured to identify the measurement value that occurs with the highest frequency in the measurement vector by grouping together nonzero values with a predetermined level of similarity.

In yet another embodiment, the dominant value index inference logic is configured to identify the measurement value that occurs with the highest frequency in the measurement vector by grouping together nonzero values with identical values.

In a further embodiment again, the dominant element index inference graph logic is configured to identify an element of a reconstructed input signal that is most likely to have resulted in the observed measurement vector by determining an element in the reconstructed input signal that is present in the rows of the measurement matrix that correspond to the elements in the measurement vector having the value that occurs with the highest frequency.

In another embodiment again, the dominant element index inference graph logic is configured to identify an element of a reconstructed input signal that is most likely to have resulted in the observed measurement vector by performing a set of hypothesis tests on subsets of the elements of the measurement vector.

In a further additional embodiment, the hypothesis tests involve comparing the mean-square error with respect to the measurement vector of different values for the undetermined bits of the element in the reconstructed input signal.

In another additional embodiment, the decoder iteratively updates the measurement vector until a termination condition is satisfied.

In a still yet further embodiment, the termination condition is a predetermined number of iterations.

In still yet another embodiment, the termination condition is the magnitude of the difference between the updated measurement vector and the previous measurement vector is less than a predetermined amount.

In a still further embodiment again, the structured measurement matrix is received from an encoder that generated the measurement vector.

In still another embodiment again, the decoder is configured to receive a set of subsets of $\{1, 2, \ldots, n\}$ of a predetermined size d, where N is the number of columns in the measurement matrix and $N=2^n$ and the decoder is further configured to generate the structured measurement matrix using the set of subsets.

An embodiment of the method of the invention includes receiving an analog input signal using an analog front end, providing the received analog input signal to a plurality of parallel channels and in each channel: generating a bit sequence using a predetermined check node using parity check logic; mixing the analog input signal with the generated bit sequence using a mixer, where the generated bit sequence has a rate greater than the Nyquist rate; discretizing the output of the mixer of a predetermined time period using a discretization circuit, where the predetermined time period corresponds to a rate that is less than the Nquist rate of the analog input signal; digitizing the discretized output of the mixer using an analog to digital converter; and outputting a plurality of measurements corresponding to the digital outputs of each of the plurality of parallel channels, where the rate of the plurality of measurements is less than the Nyquist rate of the analog input signal.

A further embodiment of the method of the invention also includes transmitting the plurality of measurements via a communication channel.

Another embodiment of the method of the invention also includes generating the predetermined check nodes by generating an (n, d) summary corresponding to each of the plurality of measurements, where each (n, d) summary is a pair (S, c), where: S is a randomly generated subset of $\{1, 2, \ldots, n\}$ of a predetermined size d, c is a binary sequence of length d, and N is the length of the binary sequence generated by the parity check logic using the check node and $N=2^n$.

A still further embodiment of the method of the invention includes receiving a measurement vector using a decoder, identifying the measurement value that occurs with the highest frequency in the measurement vector and the elements of the measurement vector that have the identified value using the decoder, using the rows of the structured measurement matrix that generated the measurement vector to identify an element of a reconstructed input signal that is most likely to have resulted in the observed measurement vector using the decoder, assigning the identified value to the identified element of the reconstructed input signal using the decoder, storing the elements of the reconstructed input signal in memory, and updating the measurement vector by subtracting the product of the measurement matrix and the reconstructed input signal from the previous measurement vector using the decoder.

In still another embodiment of the method of the invention, the measurement value that occurs with the highest frequency in the measurement vector is determined by grouping together nonzero values with a predetermined level of similarity.

In a yet further embodiment of the method of the invention, the measurement value that occurs with the highest frequency in the measurement vector is determined by grouping together nonzero values with identical values.

Yet another embodiment of the method of the invention also includes identifying an element of a reconstructed input signal that is most likely to have resulted in the observed measurement vector comprises determining an element in the reconstructed input signal that is present in the rows of the measurement matrix that correspond to the elements in the measurement vector having the value that occurs with the highest frequency using the decoder.

A further embodiment again of the method of the invention also includes identifying an element of a reconstructed input signal that is most likely to have resulted in the observed measurement vector comprises performing a set of hypothesis tests on subsets of the elements of the measurement vector using the decoder.

In another embodiment again of the method of the invention, the hypothesis tests involve comparing the mean-square error with respect to the measurement vector of different values for the undetermined bits of the element in the reconstructed input signal using the decoder.

A further additional embodiment of the method of the invention also includes iteratively updating the measurement vector using the decoder until a termination condition is satisfied.

In a still yet further embodiment of the method of the invention, the termination condition is a predetermined number of iterations.

In still yet another embodiment of the method of the invention, the termination condition is the magnitude of the difference between the updated measurement vector and the previous measurement vector is less than a predetermined amount.

A still further embodiment again of the method of the invention also includes receiving the structured measurement matrix using the decoder.

Still another embodiment again of the method of the invention also includes receiving a set of subsets of $\{1, 2, \ldots, n\}$ of a predetermined size d, where N is the number of columns in the measurement matrix and $N=2^n$, and generating the structured measurement matrix based on the set of subsets using the decoder.

A still further additional embodiment of the method of the invention also includes generating the rows of the structured measurement matrix by generating an (n, d) summary corresponding to each element of the measurement vector, where each (n, d) summary is a pair (S, c), where S is a randomly generated subset of $\{1, 2, \ldots, n\}$ of a predetermined size d, c is a binary sequence of length d, and N is the length of the binary sequence generated by the parity check logic using the check node and $N=2^n$.

BRIEF DESCRIPTION OF THE DRAWINGS

FIG. 2 illustrates an example of a measurement matrix generated in accordance with an embodiment of the invention.

DETAILED DESCRIPTION

Figure 1:
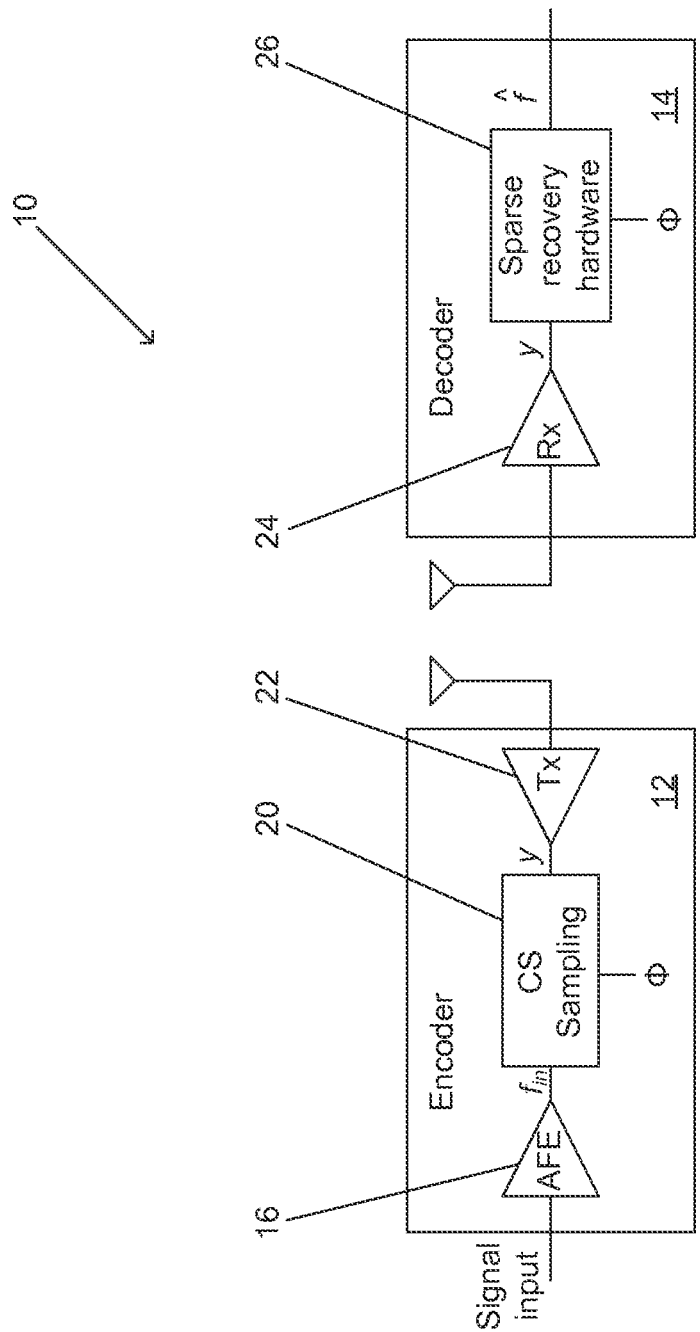
FIG. 1 illustrates a communication that utilizes an encoder configured to perform compressed sensing (CS) sampling of an input and a decoder configured to recover the input signal from the measurements made by the encoder in accordance with an embodiment of the invention.

Turning now to the drawings, systems and methods for acquiring and decoding signals using compressed sensing (CS) that utilize a structured measurement matrix selected to enable the use of a Summarized Support Index Inference (SSII) recovery process in accordance with embodiments of the invention are illustrated. As is noted in Khajehnejad et al., *Summary Based Structures with Improved Sublinear Recovery for Compressed Sensing*, arXiv:1102.5462v2 [cs.IT] 4 Mar. 2011 (incorporated by reference herein in its entirety) the computations utilized in basis pursuit (the standard recovery technique suggested by CS theory) are difficult to physically realize in an integrated implementation of a CS decoder as the computations typically utilize matrix multiplication and several other "exotic" functions such as the computation of gradients and Hessians. The expense of these computations is significant enough to constrain their use in real-time, or purely hardware or integrated decoder implementations. Thus, while CS has provided a framework for acquiring desired information more efficiently, the problem of processing the acquired data and extracting the original signal is an expensive proposition. Systems and methods in accordance with embodiments of the invention utilize a novel real-time sensing paradigm utilizing a structured measurement matrix that enables use of the sublinear time SSII recovery process, which is highly amenable to hardware implementation in real-time decoders. Although much of the discussion that follows relates to implementation of systems and methods in accordance with embodiments of the invention in hardware, it should also be appreciated that the methods described herein can also be implemented in software for use in a variety of applications that are not limited to analog signal processing and can extend to (but are not limited) to any application in which conventional CS techniques can be applied.

CS signal acquisition systems in accordance with many embodiments of the invention utilize a measurement matrix that is deterministic, structured and highly scalable. In many embodiments, the measurement matrix is specifically constructed to enable signal reconstruction using SSII. The construction of an M×N measurement matrix A is based on generating the rows of the measurement matrix using a set of M check nodes. When data or an observation vector y is acquired using a measurement matrix A constructed in this manner, the signal can be reconstructed from the data using an SSII recovery process that is capable of being implemented in a real-time hardware decoder. The SSII recovery process involves iteratively using the rows of the structured measurement matrix to identify the index of the element in the reconstructed input signal vector that is most likely to have resulted in the observed measurement vector. The detailed process is described below. Real-time decoders that implements SSII recovery processes in accordance with embodiments of the invention can be implemented in hardware and can provide an empirical over-sampling factor significantly better than existing sublinear methods. Communication systems, encoders, and decoders that employ structured measurement matrices constructed in accordance with embodiments of the invention to perform CS signal acquisition and signal reconstruction using SSII in accordance with embodiments of the invention are discussed below.

System Architecture

CS signal acquisition systems and decoders for performing signal recovery in accordance with embodiments of the invention can be utilized in an extensive array of applications. In many embodiments, the CS signal acquisition system is utilized to capture data that is then transmitted to a remote decoder, where signal recovery is performed. In several embodiments, the CS signal acquisition system stores data for signal recovery at some future point in time.

A communication system in accordance with an embodiment of the invention is illustrated in FIG. 1. The communication system 10 includes an encoder 12 incorporating a CS signal acquisition system and digitizer. The encoder receives a signal input and acquires data that is transmitted to a decoder 14 for reconstruction. In the illustrated embodiment, the encoder includes an analog front end 16 that is utilized in conjunction with CS sampling circuitry 20, which samples and digitizes the input signal using a structured measurement matrix constructed to enable reconstruction of the input signal from the sampled data using SSII. A transmitter 22 transmits the data to the decoder 14. A receiver 24 in the decoder receives the transmitted data and sparse recovery hardware 26 performs an SSII process to reconstruct the input signal.

The use of CS in the encoder enables the encoder to operate at much lower power than a system that samples the input signal at the Nyquist rate. By utilizing a measurement matrix that enables signal reconstruction using SSII, the decoder can be implemented in hardware for reconstructing the input signal in real-time.

Although the use of a CS signal acquisition system and decoder implementing an SSII recovery process are illustrated as part of a communication system in FIG. 1, CS signal acquisition systems and decoders in accordance with embodiments of the invention can be utilized in any of a variety of applications in which benefits can be obtained by performing CS. CS signal acquisition systems and decoders in accordance with embodiments of the invention are discussed further below.

Structured Measurement Matrices

CS signal acquisition systems in accordance with embodiments of the invention use a class of structured binary measurement matrices, based on the following definition:

Definition 1. Let m, n and d be integers. A (n, d) summary is a pair X=(S, c), where S is a subset of $\{1, 2, \ldots, n\}$ of size d, and c is a binary sequence of length d. A (m, n, d) summary codebook is a collection $\mathcal{C} = \{(S_i, c_j) | 1 \leq i \leq m, 0 \leq j \leq 2^d - 1\}$ of (n, d) summaries, where $S_i$'s are distinct subsets, and $c_j$ is the length d binary representation of the integer j. If $m = \binom{n}{d}$, $\mathcal{C}$ is called the complete (n, d) summary codebook.

For an input having dimensionality N and a desired number of measurements M a binary measurement matrix A of size M×N can be generated, where $M = 2^d \times m$, $N = 2^n$, $m = \binom{n}{d}$, and d is chosen based upon a desired probability of error, given a (m, n, d) summary codebook $\mathcal{C}$ chosen at random, in the following way. For every $(S, c) \in \mathcal{C}$, there is a row $a = \{a_1, \ldots, a_N\}$ in A that satisfies:

$$a_j = 1\{b_j(S) = c\} 1 \leq j \leq N$$

where $b_j$ is a n-bit binary representation of j, and $b_j(S)$ is the sequence of the binary sequence $b_j$, indexed by the entries of the set S.

In other words, a has a 1 in those columns/whose binary labeling conform to (S, c). Every row of A has exactly m nonzero entries. Although the measurement matrices described above are binary, measurement matrices in accordance with embodiments of the invention can be defined using any alphabet appropriate to a specific application. In order to illustrate the generation of measurement matrices in accordance with embodiments of the invention, an example involving generation of a measurement matrix and the use of SSII to perform signal reconstruction of compressed measurements taken using the measurement matrix is presented below. A brief discussion is provided below of the SSII recover process followed by the example. Hardware implementations of encoders and decoders in accordance with embodiments of the invention are also discussed further below.

SSII Recovery Processes

When measurements are made using a structured measurement matrix constructed in the manner outlined above, an SSII recovery process can be utilized to perform signal reconstruction. SSII is a process with sublinear performance that is capable of being implemented in hardware and in real-time. The SSII process involves iteratively inferring the nonzero entries of the signal based on the frequency of occurrence of distinct values (or similar values) of y and its various occurrences. The process is described below.

At the beginning of the process, distinct nonzero values of the observations y are identified, and are separated from the zero values. Due to the distinguishability assumption on x, and can thus be used to infer the position of at least one nonzero element. The index of a nonzero element of x is determined by its unique labeling, which is a binary sequence of length n. Therefore, the process attempts to infer all relevant binary sequences. Suppose that a nonzero value of y is chosen that has t occurrences, say without loss of generality, $y_1 = y_2 = \ldots = y_t$. Also, let the (n, d) summary which corresponds to the ith row of A be denoted by $(S_i, c_i)$. The process explores the possibility that $y_1, y_2, \ldots, y_t$ are all equal to a single nonzero element of x, by trying to build a binary sequence b that conforms to the summaries $\{(S_i, c_i)\}_{i=1}^t$, i.e., by setting:

$$b(S_i) := c_i, \forall 1 \leq i \leq t$$

If there is a conflict in the set of equations, then that value of y is discarded in the current iteration, and the search is continued for other values. Otherwise, two events may occur. If b is uniquely identified, then one nonzero position and value of x is determined. The value is subtracted, measurements are updated and the algorithm is continued. However, there might be a case where only $n_1 < n$ bits of b are determined by the above equation. In this case, the zero values of y can be used to infer the remaining $n - n_1$ bits in the following way. Let the set of known and unknown bits of b be denoted by $S_1$ and $S_2$, respectively. All subsets S among the summaries (S, c) which contribute to A are considered. If there is a subset S' such that among all the measurements corresponding to (S', c) where c does not conflict with b(S'), exactly one of them are nonzero, say (S', c'), then the bits of b over S' n $S_2$ can be uniquely determined by setting b (S')=c'. This procedure is repeated until either b is completely identified, or all possibilities are exhausted. A high level description of the presented method is as follows:

SSII Process

1: Repeat until all nonzeros of x are identified.
2: Identify distinct nonzeros of y, exhaust the following:
3: Consider all occurrences of a value $y_{\pi(1)} = y_{\pi(2)} = \ldots = y_{\pi(t)}$ (or values equal to within an allowed tolerance).
4: Construct a binary sequence b by setting $b(S_{\pi(i)}) := c_{\pi(i)}$, $\forall 1 \leq i \leq t$, where $(S_j, c_j)$ is the summary corresponding to measurement $y_j$.
5: If b is fully characterized without confliction from previous step, then a nonzero element of x has been determined, subtract it, update y and go to step 2. Otherwise, exhaust the following step.
6: Find a subset S', such that among summaries (S', c) that do not contradict with b, exactly one corresponds to a nonzero of y, say (S', c) and set b(c'):=S'.

As is discussed further below, the above process can be implemented using a graphical model with variable and function nodes that can be implemented strictly with logical operations equivalent to a parity check operation, and that of multiplication and addition. In addition, the structure of the measurement matrix also admits a very fast and efficient vector-matrix multiply operation. In order to better illustrate the generation of measurement matrices and signal recovery using the SSII process in accordance with embodiments of the invention, an example involving generation of a measurement matrix and the use of SSII to perform signal reconstruction of compressed measurements taken using the measurement matrix is presented below followed by a discussion of encoder and decoder implementations in accordance with embodiments of the invention.

EXAMPLE

Generating a Measurement Matrix and Performing Signal Reconstruction Using the SSII Recovery Process For the purposes of illustrating the generation of a measurement matrix and the performance of signal reconstruction using the SSII recovery process in accordance with embodiments of invention, a toy example follows. The scale of the toy example is not meant to convey the full potential of the algorithm, but was instead chosen as a small example that can be fully illuminated in the space below.

For a given x with dimension N≤$2^n$, sparsity level k, and desired maximum number of measurements m, where k represents the maximum number of non-trivial entries of x, there can be computed a d, which is used in the following way to generate an appropriate measurement matrix A.

Suppose n=4, therefore, N=16, and k=2 and the input signal is as follows:

$$x_{input} = [\begin{smallmatrix} 1 & 2 & 3 & 4 & 5 & 6 & 7 & 8 & 9 & 10 & 11 & 12 & 13 & 14 & 15 & 16 \\ 8.7 & 0 & 0 & 0 & 0 & 0 & 0 & 0 & 0 & 0 & 0 & 0 & 0 & 0 & 1.2 & 0 \end{smallmatrix}]$$

And assume the number of measurements m=12 and d=2.

A measurement matrix can be generated in accordance with the process outlined above as follows. Consider a particular binary number assignment for each index. In this example we make the following assignments.

| Index of $x_{input}$ | Binary Assignment |
|---|---|
| 1 | 0000 |
| 2 | 0001 |
| 3 | 0010 |
| 4 | 0011 |
| 5 | 0100 |
| 6 | 0101 |
| 7 | 0110 |
| 8 | 0111 |
| 9 | 1000 |
| 10 | 1001 |
| 11 | 1010 |
| 12 | 1011 |
| 13 | 1100 |
| 14 | 1101 |
| 15 | 1110 |
| 16 | 1111 |

A summary codebook is generated by randomly generating $$\frac{M}{2^{(n-d)}} = 3$$

distinct subsets S. For this example, 3 such sets of d=2 are:
  $S_1$=[1 3]
  $S_2$=[3 4]
  $S_3$=[2 3]

For each summary, $2^{(n-d)}$ check nodes are generated that represent the enumeration of every combination of bits with place denoted by the elements of each subset. The check nodes are as follows:
S1 sets: $R_1$=(0 X 0 X), $R_6$=(0 X 1 X), $R_9$=(1 X 0 X), $R_8$=(1 X 1 X)
S2 sets: $R_2$=(X X 0 0), $R_7$=(X X 0 1), $R_5$=(X X 1 0), $R_{10}$=(X X 1 1)
S3 sets: $R_3$=(X 0 0 X), $R_4$=(X 0 1 X), $R_{11}$=(X 1 0 X), $R_{12}$=(X 1 1 X)

As 1 and 3 are the elements of $S_1$, every combination of bits 1 and 3 are enumerated and the other bits are represented by a don't care value X. Note that this is an important detail, for every set includes every combination of the bits specified by d with all other bits listed as a don't care operation.

Each of the 12 elements of the above ($R_1$ ... $R_{12}$) represent the mapping of a check node that instructs the node to check all the indices encoded by binary representations consistent with the bits specified in the check node. So for example, the node $R_1$=(0 x 0 X) in set $S_1$ is consistent with the following 4 bit numbers, 0000, 0001, 0100, 0101, which according to TABLE 1 index entries 1, 2, 5, and 6 of $x_{input}$. This corresponds to a measurement or a row of the measurement matrix A that is generated by setting the bits corresponding to the appropriate entries of $x_{input}$ to 1 and the rest of the entries to 0. The row of the measurement matrix A generated by the check node $R_1$ is as follows:
  Row($R_1$)=[1 1 0 0 1 1 0 0 0 0 0 0 0 0 0 0].

Rows of a measurement matrix generated using the 12 elements ($R_1$ ... $R_{12}$) using the process outlined above are illustrated in FIG. 2. A measurement matrix A generated with the rows shown in FIG. 2 can be used to generate a measurement $y_{input}$ based upon the signal $x_{input}$. The measurement $y_{input}$ is as follows:
  $y_{input}$=[8.7 8.7 8.7 0 1.2 0 0 1.2 0 0 0 1.2]

Due to the structure of the measurement matrix A the input signal $x_{input}$ can be constructed from $y_{input}$ using an SSII recovery process as is discussed further below.

Figure 3:
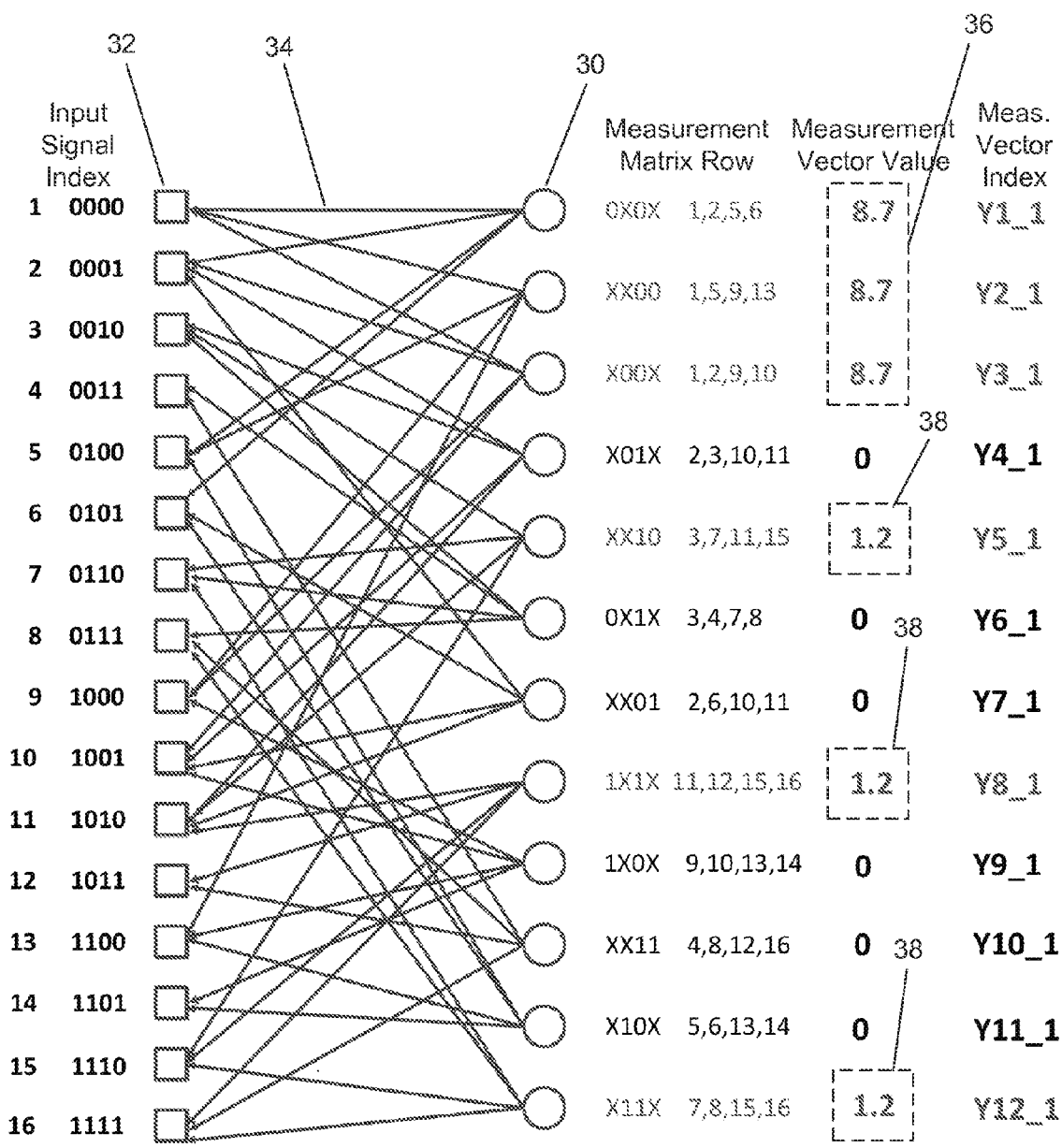
FIGS. 3-5 graphically illustrate the application of a Summarized Support Index Inference (SSII) recovery process to a measurement vector obtained using the measurement matrix shown in FIG. 2 to recover an input signal in accordance with an embodiment of the invention.
Figure 4:
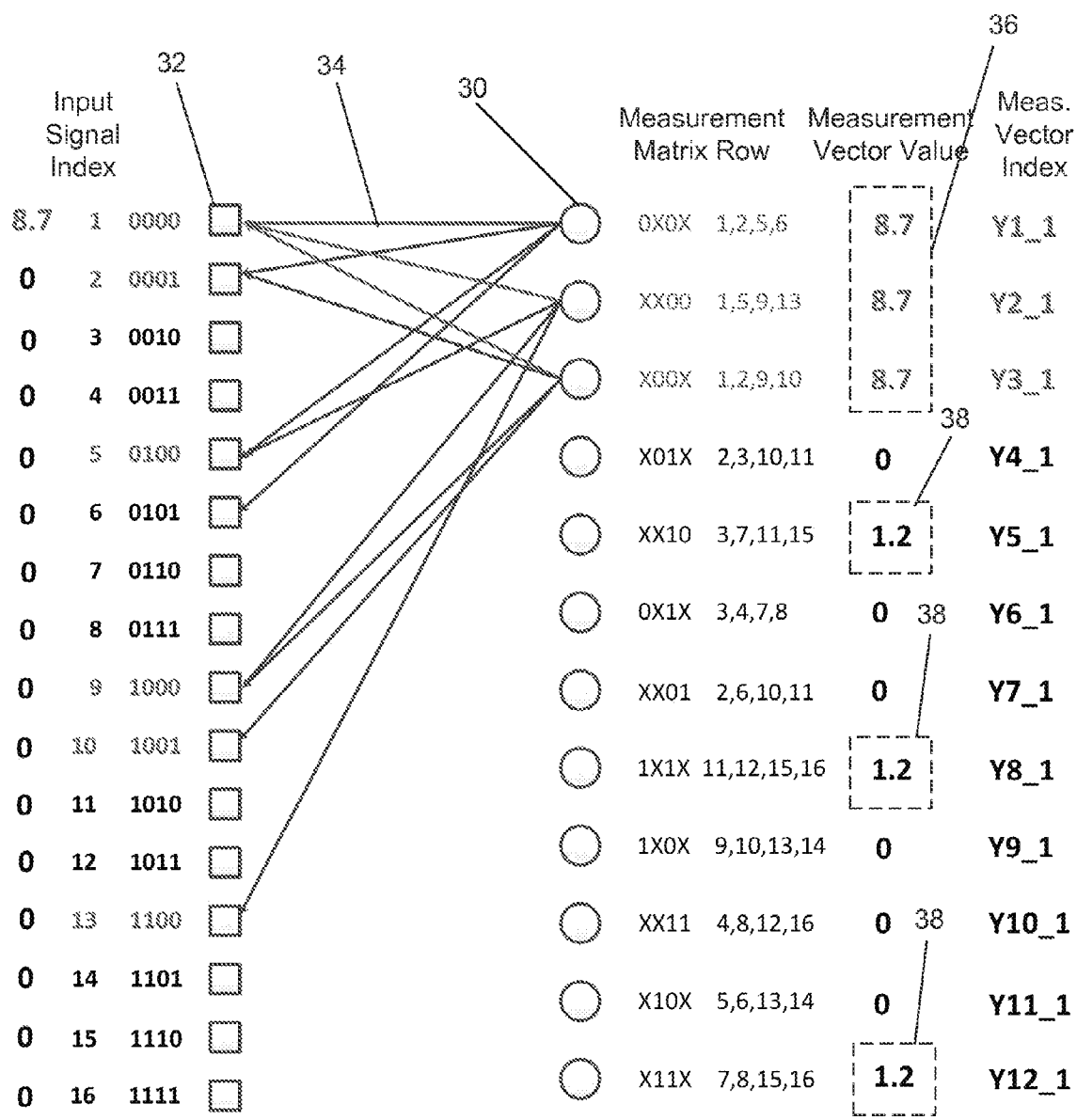

The manner in which the SSII recovery process can be utilized to reconstruct $x_{input}$ from the measurement $y_{input}$ can be graphically represented. An initial guess $x_{guess(1)}$ is generated using the value with the highest occurrence in the measurement vector using the process described above and each iteration of the process generates an updated guess vector $x_{guess(i)}$. The process of generating and updating x guess is graphically represented in FIGS. 3-5. Initially, the process starts with a set of circles 30 that each represent an element in the measurement vector $y_{input}$ and a set of squares 32 that each represent a element in the guess vector $x_{guess(1)}$. Edges 34 in the graph are drawn between the entries of the measurement vector $y_{input}$ and the entries of the guess vector $x_{guess}$ corresponding to a binary value '1' in each row in the measurement matrix illustrated in FIG. 2. In the illustrated embodiment, each element in the measurement vector $y_{input}$ has four edges connecting the value to three entries in the guess vector $x_{guess}$.

Each iteration of the process updates one and only one element of $x_{guess}$ using a most likelihood principle that attempts to locate the single most likely value within the guess vector $x_{guess}$ to have produced the observed measurement vector $y_{input}$. The process starts by grouping entries within the measurement vector $y_{input}$ based upon frequency of occurrence. An initial assumption is made that the value corresponding to the group of entries with the highest frequency of occurrence is the value of the single element within the input signal $x_{input}$ that is most likely responsible for the observations. In the illustrated embodiment, both the group of entries (36) containing the value 8.7 and the group of entries (38) containing the value 1.2 have the same number of occurrences in $y_{input}$. Therefore, either group can be processed first. In several embodiments, the group of entries that contain the highest value is processed first. In other embodiments, any of a variety of techniques can be used to determine the group of entries to process first. The element in the guess vector $x_{guess}$ that connects via edges 34 with each of the entries in the measurement vector $y_{input}$ containing the value 8.7 is then identified and the identified element in the guess vector $x_{guess}$ is assigned the value 8.7. In the illustrated embodiment, element 1 of $x_{guess}$ is assigned the value 8.7 (see FIG. 4).

Once a value for the guess vector has been determined in each iteration, a new measurement vector is generated as follows:

$$y_{input(i+1)} = y_{input(i)} - A \cdot x_{guess(i)}$$

This is done in an attempt to remove the effect of the already determined component of $x_{guess}$ so that the next most likely element of $x_{guess}$ can be computed. The process then repeats using the updated measurement vector, which in the illustrated embodiment is:

$y_{input(2)}$[0 0 0 0 1.2 0 0 1.2 0 0 0 1.2]

Figure 5:
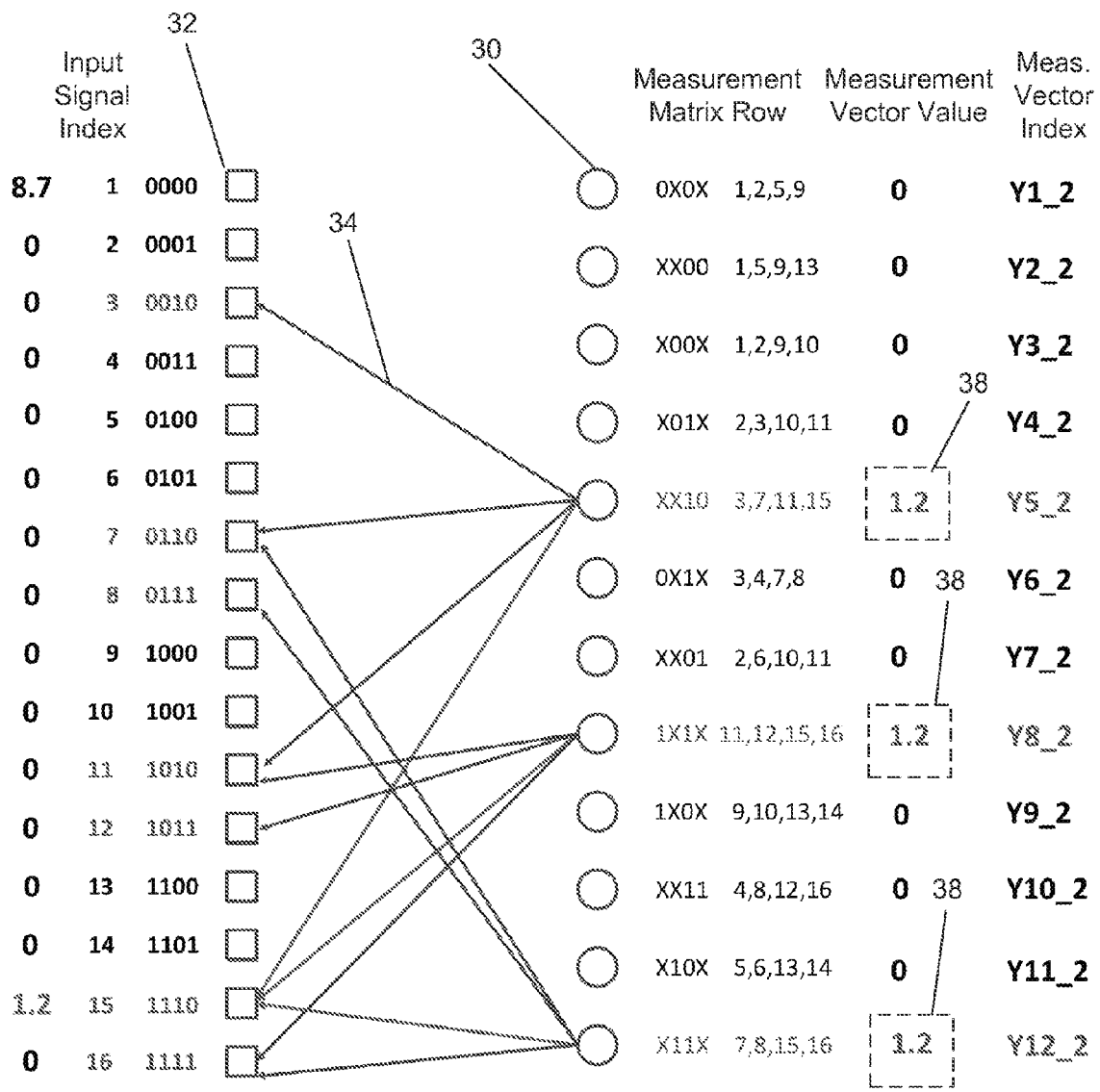

In the second iteration, the group of elements (38) with the value 1.2 occurs most frequently in the measurement vector $y_{input(2)}$. The edges that connect the elements in the measurement vector $y_{input(2)}$ with the guess vector $x_{guess}$ are illustrated in FIG. 5. Element 15 of the guess vector $x_{guess}$ connects to the three of the elements in the measurement vector $y_{input(2)}$ that contain the value 1.2. Therefore, the value 1.2 is assigned to element 15 of $x_{guess}$. At which point, $y_{input(0)}$ is a null vector and the process terminates. In the simple illustrated embodiment $x_{guess}=x_{input}$. In a number of embodiments, the process terminates when $\|A\times(x_{guess}-x_{input})\|<\epsilon$, where $\epsilon$ is a desired error tolerance. In other embodiments, any of a number of termination conditions can be utilized including (but not limited to) the number of completed iterations of the process in accordance with embodiments of the invention.

As can be readily appreciated, the above process is a simple iterative process that does not involve performing minimization processes. It can be shown that the above process can almost certainly reconstruct a k-sparse signal using M=(k log N log log N) measurements. The ability to implement the encoding and signal reconstruction processes described above in hardware in accordance with embodiments of the invention is discussed below.

Encoder Hardware Implementation

A number of factors severely limit the scalability of the existing CS signal acquisition hardware designs to larger problem dimensions. One of these factors is the generation of the measurement matrix A. In existing designs, A is typically a pseudo-random matrix generated with a linear feedback sift register (LFSR). The timing synchronization of a large number of measurements as well as the planar nature of physical implementations is very limiting. Using a more structured matrix, similar to those discussed above, can allow considerable simplification and reduction of hardware. The measurement matrix defined above is highly amendable to the implementation of practical CS signal acquisition hardware.

Figure 6:
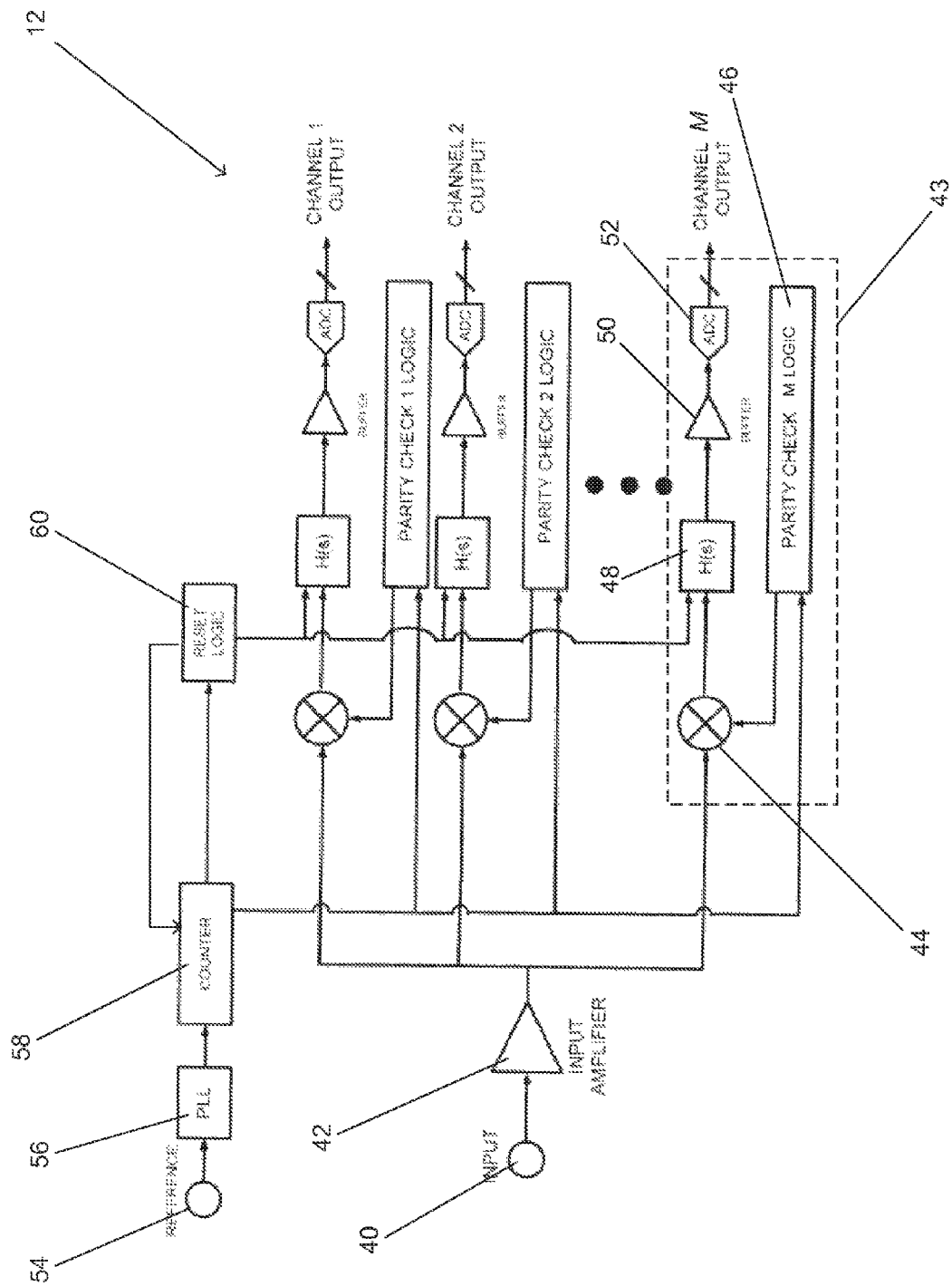
FIG. 6 illustrates a real-time hardware encoder configured to use CS sampling to sample an analog input signal in accordance with an embodiment of the invention.

A CS signal acquisition system in accordance with an embodiment of the invention is illustrated in FIG. 6. The encoder includes an input 40 configured to receive an analog input signal. The input signal is provided to an input amplifier 42 and the amplified input signal is provided to M parallel channels 43. Each channel 43 modulates 44 the input signal with a sequence of bits corresponding to a row of a measurement matrix D generated in accordance with any of the processes outlined above. In the illustrated embodiment, the bit sequences are generated by parity check logic 46. The modulation of the input signal with the bit sequence is typically performed at or above the Nyquist rate. As the Nyquist rate increases into the Gigahertz range, it is typically much easier to mix an analog signal at or above the Nyquist rate than it is to accurately sample it at the Nyquist rate. As is discussed further below, the CS signal acquisition hardware is configured to enable reconstruction of the input signal in fixed time windows [0, T]. Accordingly, the M channels make M<<N digital measurements y=φx by discretizing (48) (i.e. integrating) the modulated input signal over a fixed time period T=NΔt, where the time interval Δt is less than or equal to the inverse of the Nyquist frequency $$\left(\text{i.e. } \Delta t \le \frac{1}{f_s}\right) \cdot y = \Phi x.$$

Each measurement is buffered (50) and digitized using an analog to digital converter 52. In the illustrated embodiment, a reference clock signal 54 is provided to the encoder 12. A phase lock loop 56 is used to generate a clock signal at or above the Nyquist frequency. A digital counter 58 is used generate a bit sequence. The parity check logic 46 in each channel 43 can be used to implement a check node generated using the summary codebook used to generate the measurement matrix. The bit sequence generated by the digital counter 58 is used by the check node implemented using the parity check logic to generate the bit sequence for the corresponding row of the measurement matrix. Reset logic 60 monitors the output of the counter and resets the counter after N time periods Δt (i.e. T). The reset logic 60 also triggers the dumping (i.e. sampling and resetting) of the discretization (i.e. integration) circuitry 48.

In several embodiments, the input amplifier is implemented as two cascaded amplifiers preceding the modulator. The first is a single high gain low noise amplifier, which reduces the system noise figure. The second is a set of transconductance amplifiers, one per channel, which reduce cross-talk among channels. The cascade of amplifiers introduces a transfer function which, ideally, would have linear phase/constant magnitude response in the system bandwidth. While potentially realizable, designing amplifiers with a near "ideal" response often involves significant power consumption. Since power can trade directly with gain-bandwidth product, several embodiments of the invention place the 3 dB cutoff of the cascade at the edge of the system bandwidth.

Although a specific encoder is discussed above with respect to FIG. 6 any of a variety of encoders can be utilized to perform CS signal acquisition using a structured measurement matrix generated in accordance with embodiments of the invention. Real-time hardware decoder architectures that can perform signal reconstruction of measurements made using a structured measurement matrix in the manner described above are discussed further below.

Decoder Hardware Implementation

Figure 7:
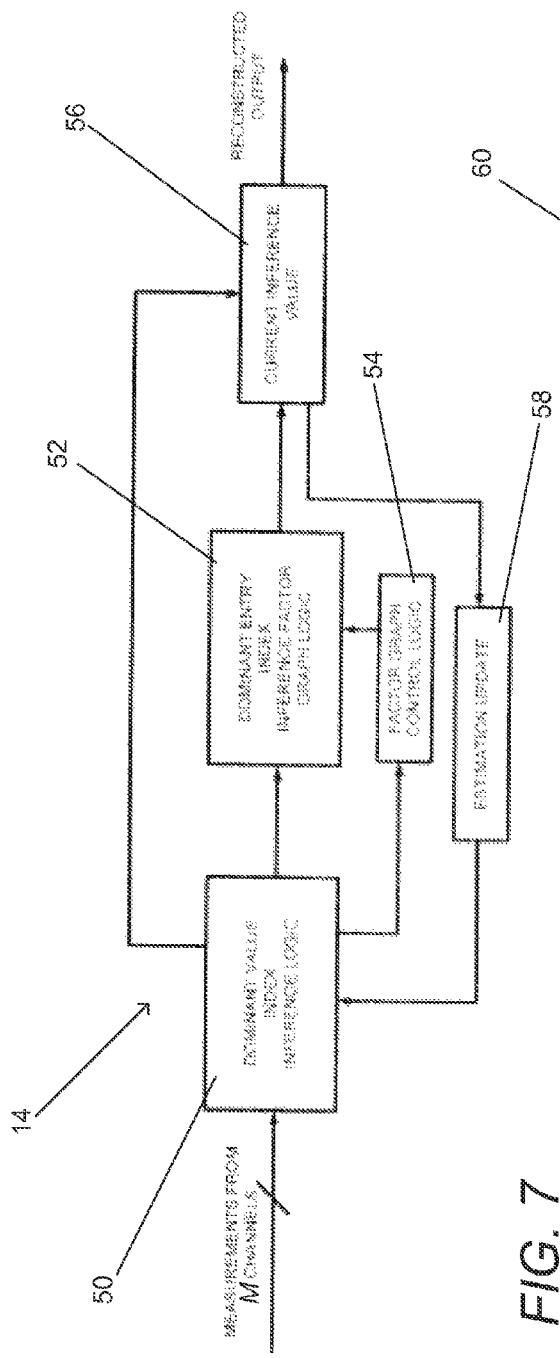
FIG. 7 illustrates a real-time hardware decoder configured to reconstruct an input signal using measurements obtained using CS sampling using SSII in accordance with an embodiment of the invention.

In current analog signal processing architectures which implement CS-based sampling, correlation between the input analog signal and a row of the measurement matrix D is typically accomplished by multiplying the input with the output of a LFSR. When a structured measurement matrix is utilized in CS signal acquisition in the manner outlined above, a decoder in accordance with embodiments of the invention can be constructed using simple binary counters and comparison logic. A decoder architecture in accordance with an embodiment of the invention is illustrated in FIG. 7. The decoder 14 receives a measurement vector including M elements as an input. The measurement vector is provided to dominant value index inference logic 50, which determines the group of elements within the measurement vector that have the value that occurs with the highest frequency (see discussion of SSII above). The indexes of the elements that include the value that occurs with the highest frequency are provided to dominant element index inference graph logic 52, which uses the rows of the structured measurement matrix to identify the index of the element in the reconstructed input signal vector that is most likely to have resulted in the observed measurement vector. Factor graph control logic 54 is provided to enable reprogramming of the values of the structured measurement matrix. The identified element is set to the most frequently occurring value in the measurement matrix and the resulting reconstructed input signal is stored in the current inference value memory 56. The reconstructed input signal is used by estimation update logic to update the measurement vector by subtracting the product of the measurement matrix and the reconstructed input signal from the previous measurement vector. As discussed above, the decoder hardware iterates the process until a termination condition is satisfied. At which point, the reconstructed input signal is output as the reconstructed input signal.

Figure 8:
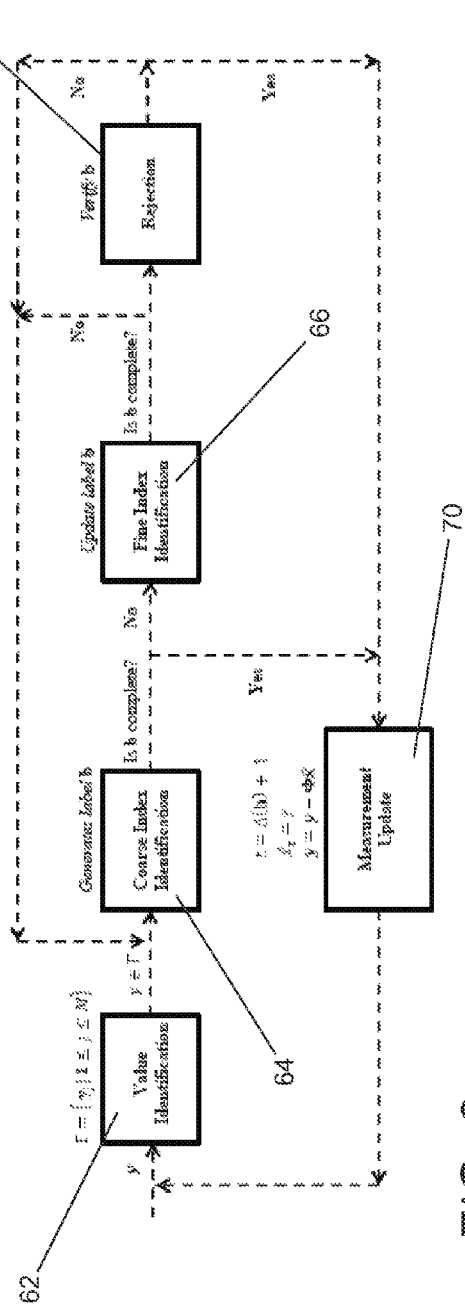
FIG. 8 illustrates a process implemented using a real-time hardware decoder for reconstructing a signal using measurements obtained using CS sampling using SSII in accordance with an embodiment of the invention.

A signal reconstruction process performed by decoder hardware implemented in accordance with an embodiment of the invention is illustrated in more detail in FIG. 8. The process 60 includes receiving a measurement vector y and performing value identification (62), which involves scanning through the entries of y and grouping together the non-zero values with (almost) equal values from the set of values $\Gamma=\{y_j | 1 \le j \le M\}$. In many embodiments, a predetermined level of similarity is used to group values. The course index identification process (64) cycles through all the occurrences of a particular value $\gamma \in \Gamma$ of the measurement vector y grouped together by the value classification process (62). For each element $y_i$ in the group, the corresponding summaries $(S_i, c_i)$ are identified, and the process attempts to identify a binary label b that conforms to all of the summaries. In the presence of noise, the subroutine settles for finding a label b that conforms to as many summaries as possible. In the case that the enforced label b is not unique and contains a few undetermined bits, a fine index identification process (66) is performed. In several embodiments, the fine index identification process tries to estimate the remaining bits by a series of simple value counting rules. In the presence of noise, this typically involves performing a set of hypothesis tests on particular subsets of the elements of y. In many embodiments, the mean-square error with respect to y of different values for the undetermined bits is determined and the bit values that provide the smallest mean square error selected. In other embodiments, any of a variety of procedures can be utilized that perform maximum likelihood estimate. When fine index identification (66) is used to complete the bit sequence b, a rejection process (68) is performed to verify that the estimated bit sequence is actually in the support set. If statistical criteria for the measurements containing the estimated bit sequence b is not satisfied, the bit sequence is rejected and the search continues. When the bit sequence is complete, it can be used to index into the unknown reconstructed input signal and to assign the value y to the indexed element of the reconstructed input signal. The measurement vector y is then updated (70) by subtracting the reconstructed input signal multiplied by the measurement matrix (i.e. $y_{(i+1)}=y_{(i)}-A.\hat{x}_{(i)}$) from the measurement vector used as the input to the previous iteration of the process. As discussed above, the process continues to iterate until a predetermined stopping condition is satisfied.

The operations performed in the illustrated process include sorting during the value identification process, a majority-selection operation during the coarse and fine index identification processes, and a matrix-vector multiplication during the verification process. The matrix-vector multiplication during the vector process can be compactly and efficiently implemented due to the fact that each row of the structured measurement matrix D has a concise encoding. The most complex computation typically utilized in a decoder in accordance with embodiments of the invention is contained in the value identification process: thresholding, sorting, and pairwise comparison of the entries of the measurement vector $y_{input}$. However, the complexity of these operations as a function of the number of observations M is unlikely to become a performance-limiting factor when compared to the pragmatic issues in implementing an encoder of corresponding size. In addition, due to the fact measurement matrices in accordance with embodiments of the invention have a highly structured and concise description, memory storage requirements scale well with size and compares favorably. As can be readily appreciated, the logic of the decoder 14 can be implemented in hardware using simple logic and arithmetic logic functions with real-time performance.

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed:

1. An encoder configured to perform compressed sensing (CS) signal acquisition and digitization using a structured measurement matrix, comprising:
   an analog front end configured to receive an analog input signal; and
   CS sampling circuitry connected to an output of the analog front end and configured to generate a plurality of measurements using a structured measurement matrix, where each row of the structured measurement matrix is generated using a different predetermined check node;
   wherein the CS sampling circuitry is configured to generate the plurality of measurements at a rate that is less than the Nyquist rate of the analog input signal.

2. The encoder of claim 1, wherein the CS sampling circuitry comprises a plurality of parallel channels, where each of the plurality of parallel channels comprises:
   parity check logic configured to generate a bit sequence using a predetermined check node;
   a mixer configured to modulate the bit sequence with the analog input signal, where the bit sequence has a rate that is greater than or equal to the Nyquist rate of the analog input signal;
   a discretization circuit configured to integrate the output of the mixer over a predetermined time period, where the predetermined time period corresponds to a rate that is less than the Nyquist rate of the analog input signal; and
   an analog to digital converter configured to digitize the output of the discretization circuit.

3. The encoder of claim 1, further comprising a transmitter configured to transmit the plurality of measurements via a communication channel.

4. The encoder of claim 1, wherein the predetermined check nodes are generated by generating an (n, d) summary corresponding to each of the plurality of measurements, where each (n, d) summary is a pair (S, c), where:
   S is a randomly generated subset of $\{1, 2, \ldots, n\}$ of a predetermined size d,
   c is a binary sequence of length d, and
   N is the length of the binary sequence generated by the parity check logic using the check node and $N=2^n$.

5. A decoder configured to reconstruct an input signal from compressed sensing (CS) measurements acquired using a structured measurement matrix, comprising:
   a receiver configured to receive a measurement vector;
   dominant value index inference logic configured to identify the measurement value that occurs with the highest frequency in the measurement vector and the elements of the measurement vector that have the identified value;

dominant element index inference graph logic configured to use the rows of the structured measurement matrix that generated the measurement vector to identify an element of a reconstructed input signal that is most likely to have resulted in the observed measurement vector and to assign the identified value to the identified element of the reconstructed input signal;

memory configured to store the elements of the reconstructed input signal;

estimate update logic configured to update the measurement vector by subtracting the product of the measurement matrix and the reconstructed input signal from the previous measurement vector.

6. The decoder of claim 5, wherein the dominant value index inference logic is configured to identify the measurement value that occurs with the highest frequency in the measurement vector by grouping together nonzero values with a predetermined level of similarity.

7. The decoder of claim 5, wherein the dominant value index inference logic is configured to identify the measurement value that occurs with the highest frequency in the measurement vector by grouping together nonzero values with identical values.

8. The decoder of claim 5, wherein the dominant element index inference graph logic is configured to identify an element of a reconstructed input signal that is most likely to have resulted in the observed measurement vector by determining an element in the reconstructed input signal that is present in the rows of the measurement matrix that correspond to the elements in the measurement vector having the value that occurs with the highest frequency.

9. The decoder of claim 5, wherein the dominant element index inference graph logic is configured to identify an element of a reconstructed input signal that is most likely to have resulted in the observed measurement vector by performing a set of hypothesis tests on subsets of the elements of the measurement vector.

10. The decoder of claim 9, wherein the hypothesis tests involve comparing the mean-square error with respect to the measurement vector of different values for the undetermined bits of the element in the reconstructed input signal.

11. The decoder of claim 5, wherein the decoder iteratively updates the measurement vector until a termination condition is satisfied.

12. The decoder of claim 11, wherein the termination condition is a predetermined number of iterations.

13. The decoder of claim 11, wherein the termination condition is the magnitude of the difference between the updated measurement vector and the previous measurement vector is less than a predetermined amount.

14. The decoder of claim 5, wherein the structured measurement matrix is received from an encoder that generated the measurement vector.

15. The decoder of claim 5, wherein the decoder is configured to receive a set of subsets of $\{1, 2, \ldots, n\}$ of a predetermined size d, where N is the number of columns in the measurement matrix and $N=2^n$ and the decoder is further configured to generate the structured measurement matrix using the set of subsets.

16. A method of encoding an analog input signal using compressed sensing (CS) signal acquisition and digitization, comprising:
    receiving an analog input signal using an analog front end;
    providing the received analog input signal to a plurality of parallel channels and in each channel:
        generating a bit sequence using a predetermined check node using parity check logic;
        mixing the analog input signal with the generated bit sequence using a mixer, where the generated bit sequence has a rate greater than the Nyquist rate;
        discretizing the output of the mixer of a predetermined time period using a discretization circuit, where the predetermined time period corresponds to a rate that is less than the Nquist rate of the analog input signal;
        digitizing the discretized output of the mixer using an analog to digital converter; and
    outputting a plurality of measurements corresponding to the digital outputs of each of the plurality of parallel channels, where the rate of the plurality of measurements is less than the Nyquist rate of the analog input signal.

17. The method of claim 16, further comprising transmitting the plurality of measurements via a communication channel.

18. The method of claim 16, further comprising generating the predetermined check nodes by generating an (n, d) summary corresponding to each of the plurality of measurements, where each (n, d) summary is a pair (S, c), where:
    S is a randomly generated subset of $\{1, 2, \ldots, n\}$ of a predetermined size d,
    c is a binary sequence of length d, and
    N is the length of the binary sequence generated by the parity check logic using the check node and $N=2^n$.

19. A method of reconstructing an input signal from compressed sensing (CS) measurements acquired using a structured measurement matrix, comprising:
    receiving a measurement vector using a decoder;
    identifying the measurement value that occurs with the highest frequency in the measurement vector and the elements of the measurement vector that have the identified value using the decoder;
    using the rows of the structured measurement matrix that generated the measurement vector to identify an element of a reconstructed input signal that is most likely to have resulted in the observed measurement vector using the decoder;
    assigning the identified value to the identified element of the reconstructed input signal using the decoder;
    storing the elements of the reconstructed input signal in memory;
    updating the measurement vector by subtracting the product of the measurement matrix and the reconstructed input signal from the previous measurement vector using the decoder.

20. The method of claim 19, wherein the measurement value that occurs with the highest frequency in the measurement vector is determined by grouping together nonzero values with a predetermined level of similarity.

21. The method of claim 19, wherein the measurement value that occurs with the highest frequency in the measurement vector is determined by grouping together nonzero values with identical values.

22. The method of claim 19, identifying an element of a reconstructed input signal that is most likely to have resulted in the observed measurement vector comprises determining an element in the reconstructed input signal that is present in the rows of the measurement matrix that correspond to the elements in the measurement vector having the value that occurs with the highest frequency using the decoder.

23. The method of claim 19, wherein identifying an element of a reconstructed input signal that is most likely to have resulted in the observed measurement vector comprises performing a set of hypothesis tests on subsets of the elements of the measurement vector using the decoder.

24. The method of claim 23, wherein the hypothesis tests involve comparing the mean-square error with respect to the measurement vector of different values for the undetermined bits of the element in the reconstructed input signal using the decoder.

25. The method of claim 19, further comprising iteratively updating the measurement vector using the decoder until a termination condition is satisfied.

26. The method of claim 25, wherein the termination condition is a predetermined number of iterations.

27. The method of claim 25, wherein the termination condition is the magnitude of the difference between the updated measurement vector and the previous measurement vector is less than a predetermined amount.

28. The method of claim 19, further comprising receiving the structured measurement matrix using the decoder.

29. The method of claim 19, further comprising:
  receiving a set of subsets of $\{1, 2, \ldots, n\}$ of a predetermined size d, where N is the number of columns in the measurement matrix and $N=2^n$; and
  generating the structured measurement matrix based on the set of subsets using the decoder.

30. The method of claim 29, further comprising generating the rows of the structured measurement matrix by generating an (n, d) summary corresponding to each element of the measurement vector, where each (n, d) summary is a pair (S, c), where:
  S is a randomly generated subset of $\{1, 2, \ldots, n\}$ of a predetermined size d,
  c is a binary sequence of length d, and
  N is the length of the binary sequence generated by the parity check logic using the check node and $N=2^n$.

* * * * *

UNITED STATES PATENT AND TRADEMARK OFFICE
CERTIFICATE OF CORRECTION

PATENT NO.        : 8,648,742 B2                                               Page 1 of 1
APPLICATION NO.   : 13/406509
DATED             : February 11, 2014
INVENTOR(S)       : Mohammad Khajehnejad, Babak Hassibi and Juhwan Yoo It is certified that error appears in the above-identified patent and that said Letters Patent is hereby corrected as shown below:

In the Specification

Please add the following paragraph beginning on Column 1, Line 5:
Federal Funding Support
This invention was made with government support under CNS0932428
awarded by National Science Foundation. The government has certain rights in the invention.

Signed and Sealed this
Twentieth Day of May, 2014

Michelle K. Lee
*Deputy Director of the United States Patent and Trademark Office*